United States Patent
Kamigaki et al.

[11] Patent Number: 5,866,946
[45] Date of Patent: Feb. 2, 1999

[54] SEMICONDUCTOR DEVICE HAVING A PLUG FOR DIFFUSING HYDROGEN INTO A SEMICONDUCTOR SUBSTRATE

[75] Inventors: Tetsuya Kamigaki, Fishkill; Mutsuo Morikado, Poughkeepsie, both of N.Y.

[73] Assignee: Kabushiki Kaisha Toshiba, Kawasaki, Japan

[21] Appl. No.: 652,405

[22] Filed: May 23, 1996

[51] Int. Cl.[6] .......................... H01L 23/12; H01L 23/48; H01L 23/52; H01L 29/40
[52] U.S. Cl. ............................ 257/751; 257/754
[58] Field of Search .................. 257/751, 754, 257/314, 202, 306, 210, 211

[56] References Cited

U.S. PATENT DOCUMENTS

| | | |
|---|---|---|
| 4,857,080 | 8/1989 | Baker et al. . |
| 4,883,766 | 11/1989 | Ishida et al. .............................. 437/40 |
| 4,943,837 | 7/1990 | Konishi et al. ......................... 357/23.7 |
| 5,055,427 | 10/1991 | Haskell et al. .......................... 437/203 |
| 5,250,444 | 10/1993 | Khan et al. .............................. 437/24 |
| 5,281,548 | 1/1994 | Prall .......................................... 437/43 |
| 5,321,306 | 6/1994 | Choi et al. . |
| 5,401,685 | 3/1995 | Ha .......................................... 437/160 |
| 5,414,655 | 5/1995 | Ozaki et al. . |
| 5,600,165 | 2/1997 | Tsukamoto . |
| 5,691,220 | 11/1997 | Ohnishi et al. . |

Primary Examiner—Mahshid D. Saadat
Assistant Examiner—S. V. Clark
Attorney, Agent, or Firm—Banner & Witcoff, Ltd.

[57] ABSTRACT

A semiconductor device formed on a semiconductor substrate includes a layer which is substantially a barrier to hydrogen formed on the semiconductor substrate. A plug, formed of a material through which hydrogen can diffuse, is disposed in an opening through the layer and contacts a surface of the semiconductor substrate. Hydrogen may be diffused into the semiconductor substrate through the plug.

12 Claims, 10 Drawing Sheets

SEMICONDUCTOR DEVICE HAVING A PLUG FOR DIFFUSING HYDROGEN INTO A SEMICONDUCTOR SUBSTRATE

BACKGROUND OF THE INVENTION

1. Technical Field

The present invention generally relates to a semiconductor device and, more particularly, to a semiconductor device having a plug for diffusing hydrogen into a semiconductor substrate which is covered by one or more layers which substantially form a barrier to hydrogen diffusion.

2. Description of Related Art

Junction leakage is a well-known problem for semiconductor devices such as transistors and can adversely affect device operation and performance. One technique for reducing junction leakage diffuses hydrogen into the semiconductor substrate on which the semiconductor devices are fabricated. This diffusion may be accomplished by an annealing process (typically at a temperature in the range from about 400° to about 600° C.) in an atmosphere containing hydrogen. The source of hydrogen may be a gas which consists of $H_2$ and $N_2$. Pure $H_2$ (100% $H_2$) may also be used. The diffused hydrogen terminates the surface states and reduces junction leakage.

FIG. 1 is a sectional view of a portion of a conventional semiconductor device which includes a transistor 10 formed on a semiconductor substrate 1. Transistor 10 may, for example, be formed in a peripheral circuit region of a semiconductor memory device such as a dynamic random access memory device (DRAM) or may be part of a logic circuit. Transistor 10 includes a source/drain diffusion region 2 and a drain/source diffusion region 3 which are spaced apart by a channel region 4. A gate electrode 6 is insulatively spaced from channel region 4 by a gate insulating layer 5. Source/drain region 2 and drain/source region 3 may be formed, for example, by performing an ion implantation using gate electrode 6 as an implantation mask. An isolation region 7 of an insulator such as silicon dioxide ($SiO_2$) electrically isolates transistor 10 from other elements formed on semiconductor substrate 1.

In high density large scale integrated circuit (LSI) devices such as 64 Mbit and 256 Mbit DRAMs, a self-aligned contact (SAC) process is often utilized for forming device contacts. Using an SAC process, the spacing between the contacts can be reduced and a high integration density can be achieved. In many SAC processes, a silicon nitride layer is formed over the LSI device area to serve as an etch-stop layer. As a result, with reference to FIG. 1, a silicon nitride layer 8 is formed over isolation region 7, source/drain region 2, drain/source region 3, and gate electrode 6. However, silicon nitride layer 8 is substantially a diffusion barrier and thus prevents the diffusion of hydrogen into semiconductor substrate 1. Thus, in high density LSIs in which a silicon nitride layer is formed during an SAC process, the diffusion of hydrogen into semiconductor substrate 1 to reduce junction leakage is prevented. This is a particular problem, for example, for transistors in the peripheral circuit region of a DRAM or for transistors in a logic circuit. While hydrogen could be diffused into the substrate before the silicon nitride layer is formed, the hydrogen can be easily removed from the surface states by high temperature LSI process steps which follow the formation of the silicon nitride layer. Thus, the hydrogen diffusion is most effectively carried out after the high temperature steps of the LSI fabrication process. However, as described above, at this time, the silicon nitride layer acts as a barrier to such diffusion.

SUMMARY OF THE INVENTION

In accordance with one aspect of the present invention, a semiconductor device formed on a semiconductor substrate includes a layer on the semiconductor substrate which is substantially a barrier to hydrogen. A plug, formed of a material through which hydrogen can diffuse, is provided in an opening through the layer and contacts a surface of the semiconductor substrate. The plug is not electrically connected to the semiconductor device.

In accordance with another aspect of the present invention, a method of diffusing hydrogen into a peripheral circuit region of a semiconductor memory device formed on a semiconductor substrate and having a layer formed thereon of a material which is substantially a barrier to hydrogen diffusion is provided. An opening is formed through the layer to expose a portion of the semiconductor substrate in the peripheral circuit region. Then, a plug is formed in the opening. The plug is formed of a material through which hydrogen can diffuse. Hydrogen is diffused into the semiconductor substrate in the peripheral circuit region through the plug.

In accordance with another aspect of the present invention, a semiconductor device is provided which includes a semiconductor substrate of a first conductivity type. An isolation region is formed on the semiconductor substrate to define an isolated element region. A transistor is formed in the isolated element region, the transistor having source and drain regions of a second conductivity type formed in the semiconductor substrate and spaced apart by a channel region, and a gate electrode insulatively spaced from the channel region. A layer is formed on the source and drain regions, the gate electrode, and the isolation region. The layer is substantially a barrier to hydrogen diffusion. An opening is formed in the layer to expose at least one of the source region, the drain region, and the isolation region and a plug is formed in the opening. The plug is formed of a material through which hydrogen can diffuse and the plug is not electrically connected to the semiconductor device.

In accordance with yet another aspect of the present invention, a method of manufacturing a semiconductor device on a semiconductor substrate on which is formed a layer which is substantially a barrier to hydrogen diffusion is provided. An opening is formed through the layer to expose a portion of the semiconductor substrate. A plug is formed in the opening, the plug being formed of a material through which hydrogen can diffuse. Hydrogen is diffused into the semiconductor substrate through the plug. The semiconductor device is completed such that the plug is not electrically connected to the semiconductor device.

In accordance with still another aspect of the present invention, a semiconductor memory device is provided on a semiconductor substrate of a first conductivity type which includes a memory cell region and a peripheral circuit region. A memory cell is formed in the memory cell region. The memory cell includes a data storage capacitor and a switching transistor having source and drain regions spaced apart by a channel region and a gate electrode insulatively spaced from the channel region. A first plug contacts one of the source and drain regions and electrically connects the one of the source and drain regions to the switching transistor. A second plug contacts the semiconductor substrate in the peripheral circuit region and is not electrically connected to the semiconductor memory device.

In accordance with still another aspect of the present invention, a method of manufacturing a semiconductor memory device includes a step of forming a memory cell on a semiconductor substrate of a first conductivity type having a memory cell region and a peripheral circuit region. The memory cell is formed in the memory cell region and includes a data storage capacitor and a switching transistor having source and drain regions of a second conductivity type spaced apart by a channel region and a gate electrode insulatively spaced from the channel region. A layer is formed is over the memory cell region and the peripheral circuit region which is substantially a barrier to diffusion of hydrogen. A first opening is formed through the layer to expose one of the source and drain regions and a second opening is formed through the layer to expose a portion of the semiconductor substrate in the peripheral circuit region. Respective first and second plugs are formed in the first and second openings. Hydrogen is diffused into the semiconductor substrate through the first and second plugs. The semiconductor memory device is completed and the second plug is not electrically connected to the semiconductor memory device.

These and other features and advantages of the present invention will be better understood from a reading of the following detailed description in conjunction with the accompanying drawings.

DETAILED DESCRIPTION

Figure 1:
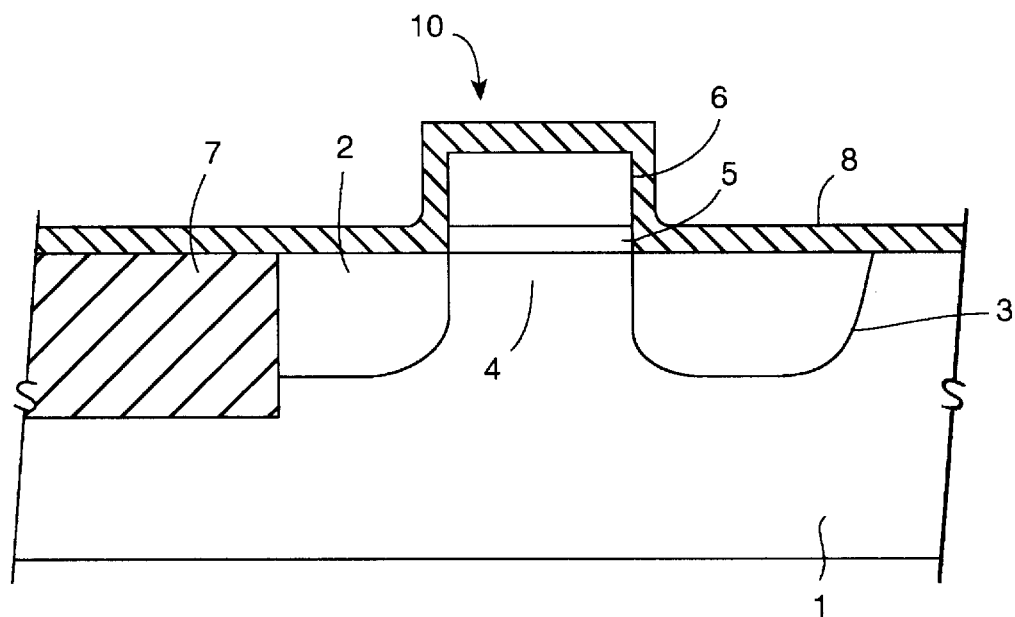
FIG. 1 is a sectional view of a portion of a conventional semiconductor device.

The elements of the portions of the semiconductor devices shown in FIGS. 2–5 which are the same as those of the portion of the semiconductor device shown in FIG. 1 are designated with the same reference numbers.

Figure 2:
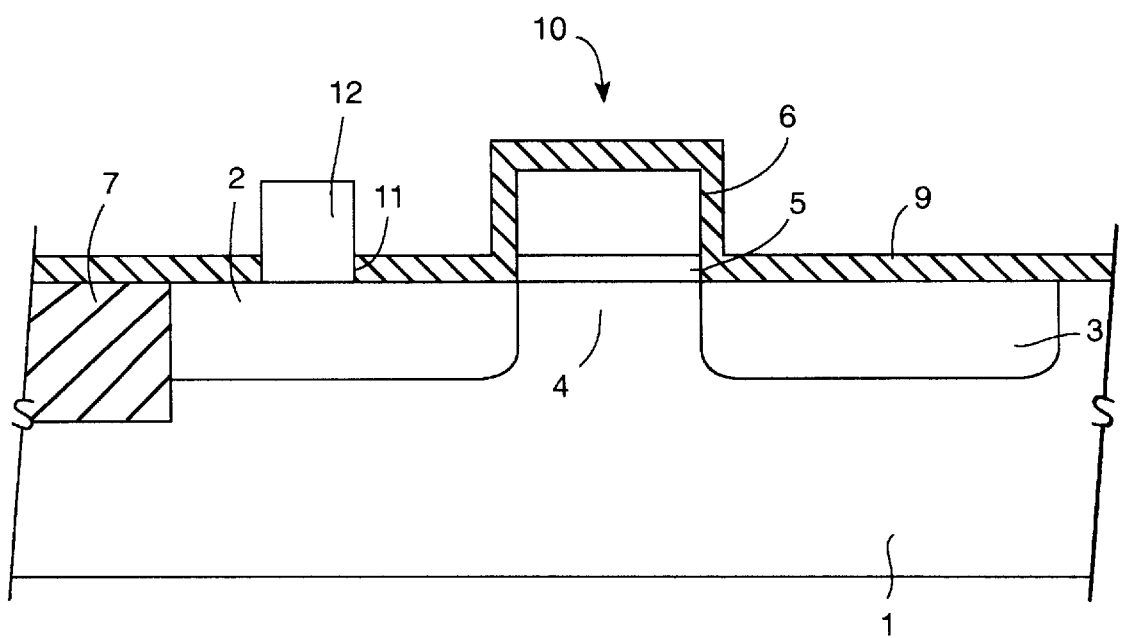
FIG. 2 is a sectional view of a portion of a semiconductor device in accordance with one embodiment of the present invention.

Referring to FIG. 2, a portion of a semiconductor device including a transistor 10 formed on a semiconductor substrate 1 of a first conductivity type (e.g., P-type or N-type) is shown. By way of example, but not by way of limitation, transistor 10 may be part of a peripheral circuit of a semiconductor memory device (e.g., a decoder circuit) or may be part of a logic circuit. Transistor 10 includes a source/drain diffusion region 2 and a drain/source diffusion region 3 of a second conductivity type arranged in an upper surface of semiconductor substrate 1 and spaced apart by a channel region 4. A gate electrode 6 is insulatively spaced from channel region 4 by a gate insulating layer 5. An isolation region 7 of an insulator such as silicon dioxide ($SiO_2$), for example, is disposed in the upper surface of semiconductor substrate 1 and electrically isolates transistor 10 from other elements formed on semiconductor substrate 1. A layer 9 of a material which is substantially a barrier to the diffusion of hydrogen is disposed over source/drain region 2, drain/source region 3, gate electrode 6, and isolation region 7. Layer 9 may, for example, be a nonporous layer consisting solely of silicon nitride ($Si_3N_4$) layer formed during a self-aligned contact process. It will, however, be appreciated that the present invention is not limited to layer 9 being such a silicon nitride layer. The present invention may generally be used where layer 9 is any layer or layers which substantially prevent or block the diffusion of hydrogen into semiconductor substrate 1. In addition, although layer 9 is shown in FIG. 2 as being directly formed on source/drain region 2, drain/source region 3, gate electrode 6, and isolation region 7, it will be appreciated that the invention is not limited in this respect.

An opening 11 is formed through layer 9 to expose an upper surface of source/drain region 2. A polycrystalline silicon plug 12 is formed in opening 11 and contacts the exposed upper surface of source/drain region 2. The hydrogen diffusion length L in silicon is given by $$L = \sqrt{Dt} \tag{1}$$

where $$D -\!\!-\!\!= D_0 \exp\left(-\frac{E_a}{kT}\right)\left[\frac{cm^2}{sec}\right] \tag{2}$$

$$t = \text{time [sec]} \tag{3}$$

$$D_0(\text{hydrogen}) = 9.4 \times 10^{-3} \left[\frac{cm^2}{sec}\right] \tag{4}$$

$$E_a(\text{hydrogen}) = 0.48[ev] \tag{5}$$

$$k = 8.63 \times 10^{-5}[ev/\text{molecule} - K] \tag{6}$$

$$T = \text{temperature } [K] \tag{7}$$

Figure 3:
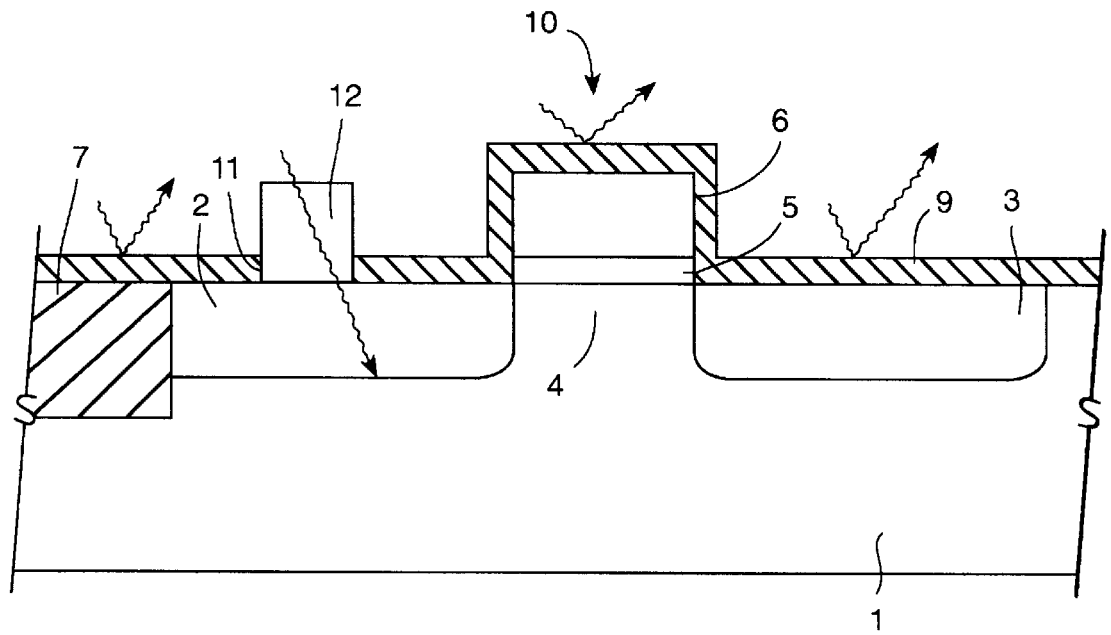
FIG. 3 illustrates the introduction of hydrogen into the semiconductor substrate 1 shown in FIG. 2.

The value for $D_0$ set forth above has been determined for single crystal silicon. The difference in $D_0$ for single crystal silicon, polycrystalline silicon, and amorphous silicon is believed to be relatively small. Thus, a 400° C. gas anneal for 15 minutes will diffuse hydrogen about 450 micrometers ($\mu$m) in the silicon substrate. Accordingly, even though layer 9 acts as a substantial barrier to the diffusion of hydrogen, when polycrystalline silicon plug 12 is arranged in the manner taught by the present invention, hydrogen can be diffused into semiconductor substrate 1 as shown in FIG. 3. In this way, junction leakage may be reduced. It is not necessary to electrically connect polycrystalline silicon plug 12 to the semiconductor device. Thus, the polycrystalline silicon plug 12 of FIG. 3 may be electrically connected only to source/drain region 2 whereby no electrical signals are transmitted via the plug 12. Thus, if the transistor of FIG. 3 is part of a peripheral circuit of a semiconductor memory device such as a DRAM or part of a logic circuit, polycrystalline silicon plug 12 need not be electrically connected to the device. While the plug 12 has been described above as being formed of polycrystalline silicon, the invention is not limited in this respect. Plug 12 may be formed of other materials, such as amorphous silicon, $SiO_2$ or SiON, through which hydrogen may diffuse.

The diffusion length of hydrogen in silicon is relatively long. Thus, it is not necessary that plugs be arranged for every transistor formed on semiconductor substrate 1. For example, it is sufficient that one plug be arranged approximately every 100 micrometers. Plugs which are arranged at this interval do not significantly affect the density of a semiconductor device. Accordingly, the integration density of a semiconductor device including the plugs of the present invention is approximately the same as the integration density of conventional devices.

Figure 4:
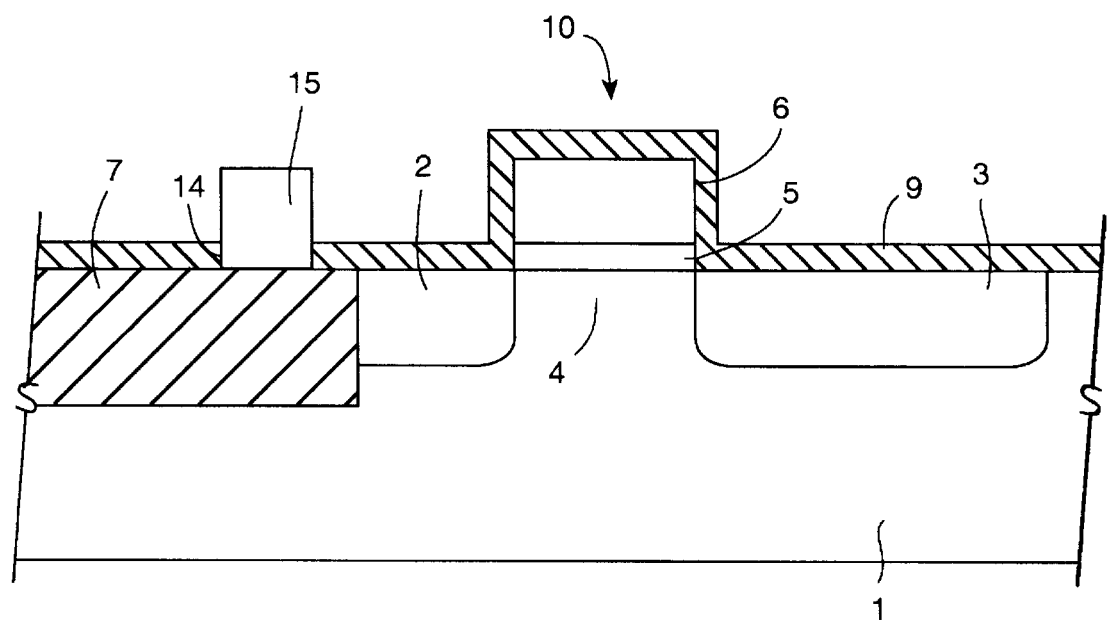
FIG. 4 is a sectional view of a portion of a semiconductor device in accordance with a second embodiment of the present invention.
Figure 5:
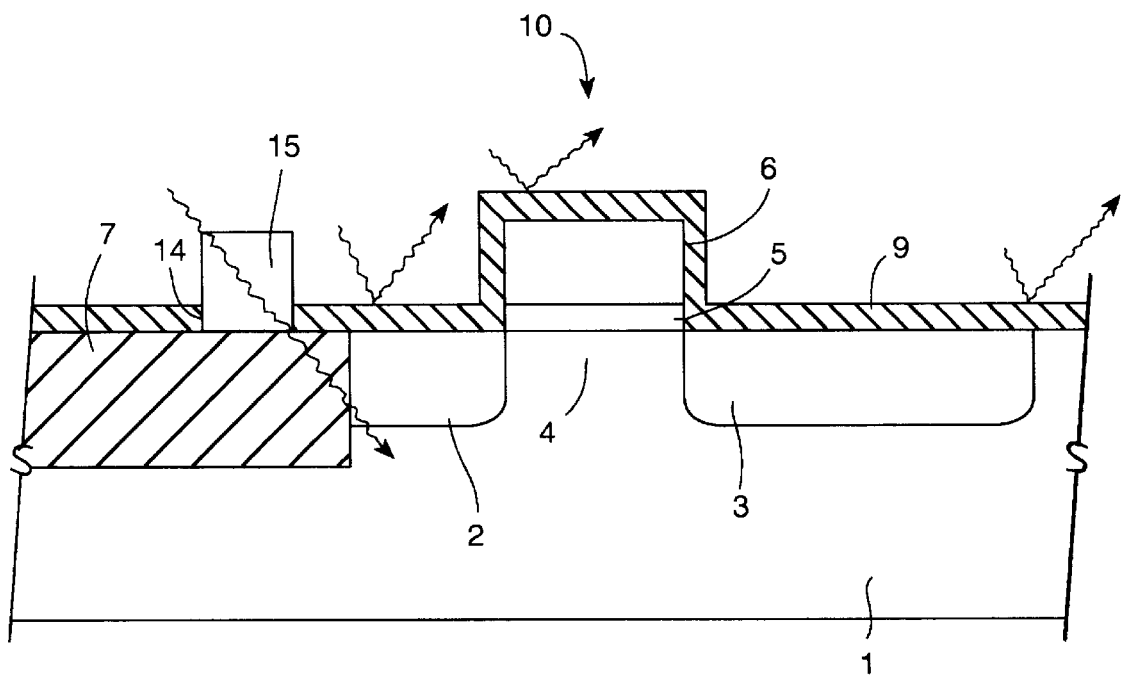
FIG. 5 illustrates the introduction of hydrogen into the semiconductor substrate shown in FIG. 4.

FIG. 4 illustrates a portion of a semiconductor device in accordance with another embodiment of the present invention. A transistor 10 formed on a semiconductor substrate 1 includes a source/drain region 2 and a drain/source region 3 disposed in an upper surface of semiconductor substrate 1 and spaced apart by a channel region 4. A gate electrode 6 is insulatively spaced from channel region 4 by a gate insulating layer 5. An isolation region 7 of an insulator such as silicon dioxide is disposed in the upper surface of the semiconductor substrate 1 and electrically isolates transistor 10 from other elements formed on semiconductor substrate 1. A layer 9 of a material which is a barrier to the diffusion of hydrogen is disposed over source/drain region 2, drain/source region 3, gate electrode 6, and isolation region 7. Layer 9 may, for example, be a silicon nitride layer formed during a self-aligned contact process. An opening 14 is formed in layer 9 to expose an upper surface of isolation region 7. A polycrystalline silicon plug 15 is formed in opening 14 and contacts the exposed upper surface of isolation region 7. Since hydrogen can diffuse through the silicon dioxide isolation region 7, hydrogen can be introduced into semiconductor substrate 1 as shown in FIG. 5. In this manner, the same benefit of reducing junction leakage as described above with respect to the embodiment of FIG. 2 may be achieved. As in the embodiment of FIG. 2, polycrystalline silicon plug 15 need not be electrically connected to any circuit elements and thus no electrical signals are transmitted through the plug. Also, polycrystalline plug 15 may be of another material, e.g., amorphous silicon, $SiO_2$ or SiON, which permits hydrogen to diffuse therethrough. As in the embodiment of FIG. 2, it is sufficient that one plug be arranged every 100 micrometers.

Figure 6A:
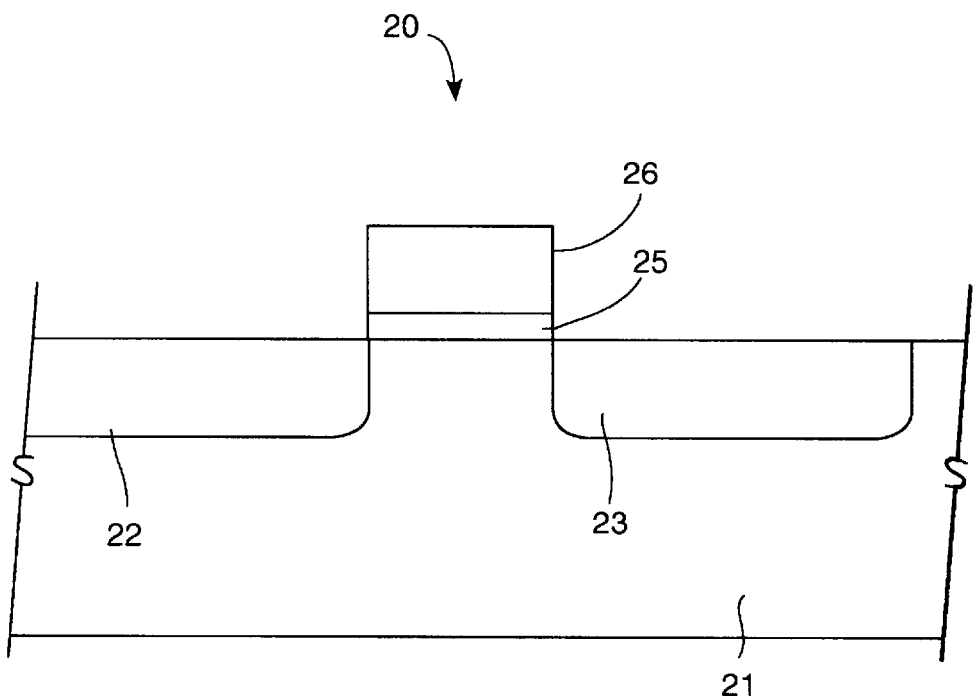
FIGS. 6A–6G generally illustrate a method for manufacturing a semiconductor device in accordance with the present invention.
Figure 6B:
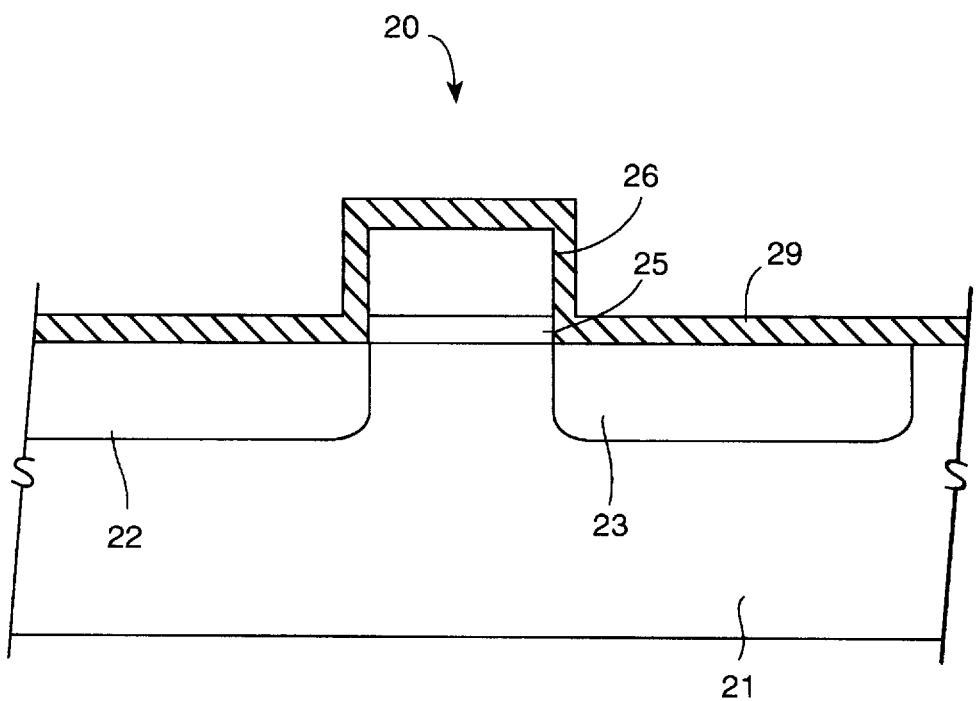
Figure 6C:
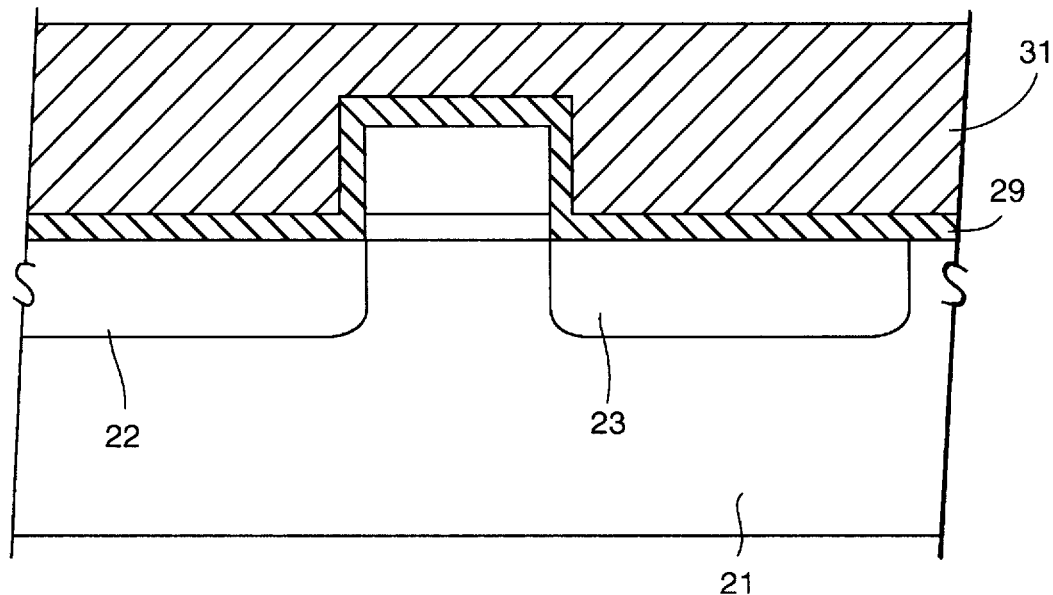
Figure 6D:
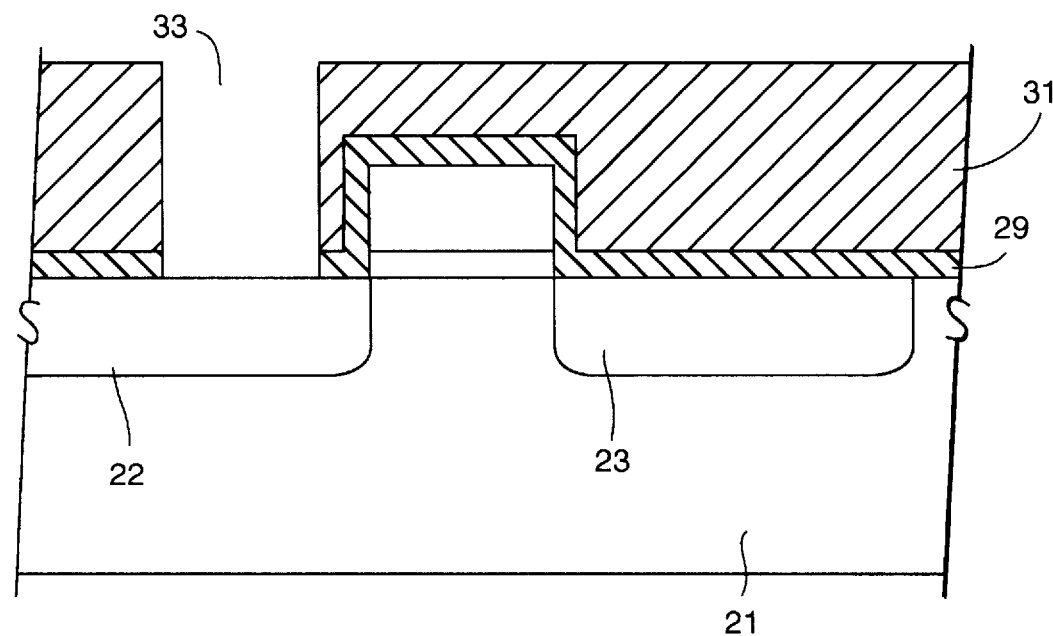
Figure 6E:
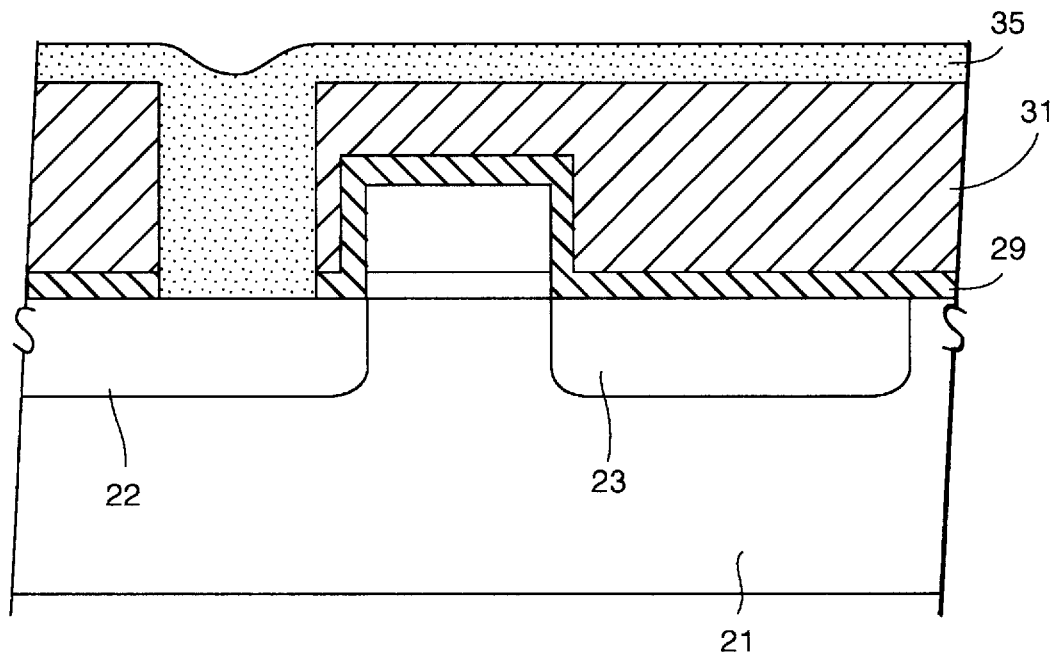
Figure 6F:
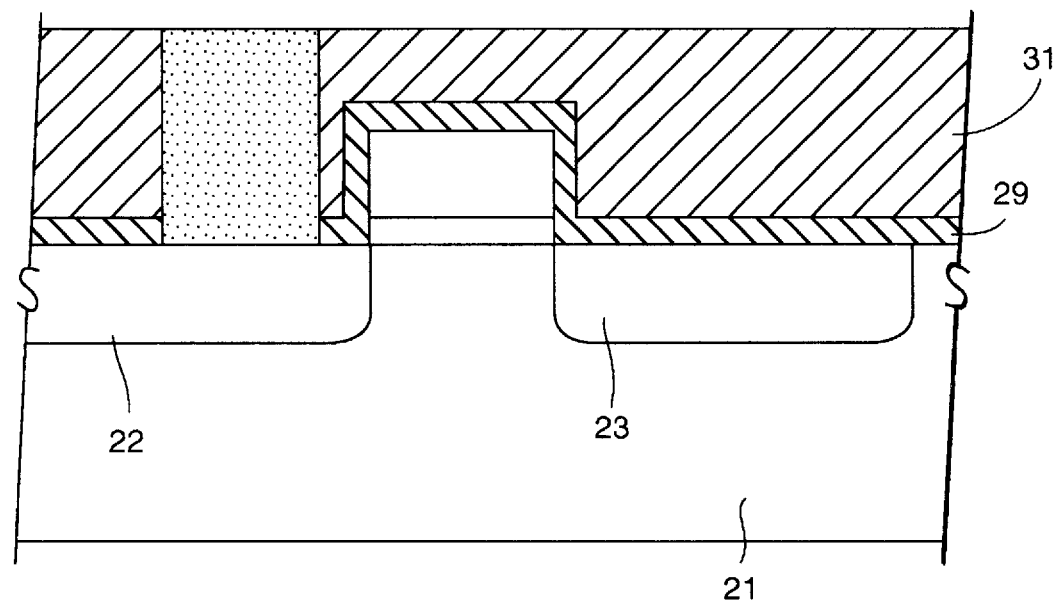
Figure 6G:
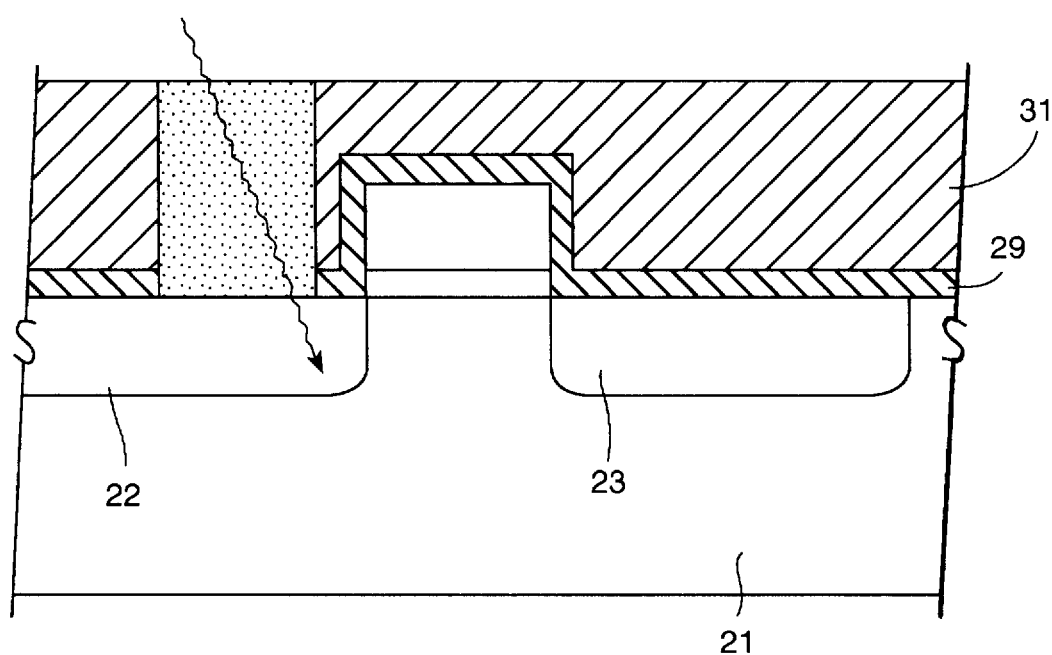

A method for manufacturing a semiconductor device in accordance with the present invention is generally shown in FIGS. 6A–6J. Referring to FIG. 6A, a transistor 20 including a source/drain region 22, a drain/source region 23, a gate insulating layer 25, and a gate electrode 26 is formed on a semiconductor substrate 21. Transistor 20 may be formed in any manner known in the art. A silicon nitride layer 29 of about 20 nanometers, for example, is then formed over source/drain region 22, drain/source region 23, and gate electrode 26 as shown in FIG. 6B. Next, as shown in FIG. 6C, a layer 31 of about 450 nanometers, for example, is formed on silicon nitride layer 29. Layer 31 may, for example, be a BPSG (boron-phosphorus-silicate-glass) layer or a silicon dioxide ($SiO_2$) layer. An opening 33 exposing an upper surface of source/drain region 2 is formed through layer 31 and silicon nitride layer 29 using a photolithography process followed by an etching process as shown in FIG. 6D. In a 16 Mbit DRAM device, opening 33 may be 0.50 micrometers wide; in a 64 Mbit DRAM device, 0.40 micrometers wide; and in a 256 Mbit DRAM device, 0.25 micrometers wide. Of course, these values are for exemplary purposes only. Next, as shown in FIG. 6E, a polycrystalline silicon layer 35 is deposited on layer 31 and in opening 33. Polycrystalline silicon layer 35 is formed to have a thickness greater than one-half of the diameter of opening 33. Referring to FIG. 6F, polycrystalline silicon layer 35 is etched or polished to be level with the upper surface of layer 31. The etching or polishing may be carried out using any convenient technique, e.g., reactive ion etching or chemical mechanical polishing. Next, as shown in FIG. 6G, hydrogen is introduced into semiconductor substrate 21 by diffusion through the polysilicon plug formed in opening 33. This diffusion may be carried out, for example, by a gas anneal at 400° C. for 15 minutes.

Figure 7A:
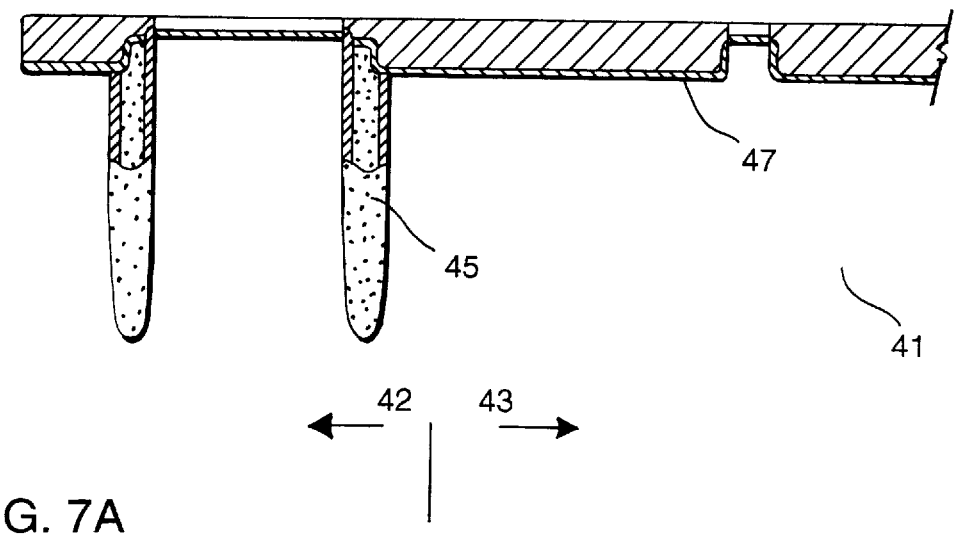
FIGS. 7A–7E illustrate a method for manufacturing a dynamic random access memory (DRAM) in accordance with the present invention.
Figure 7B:
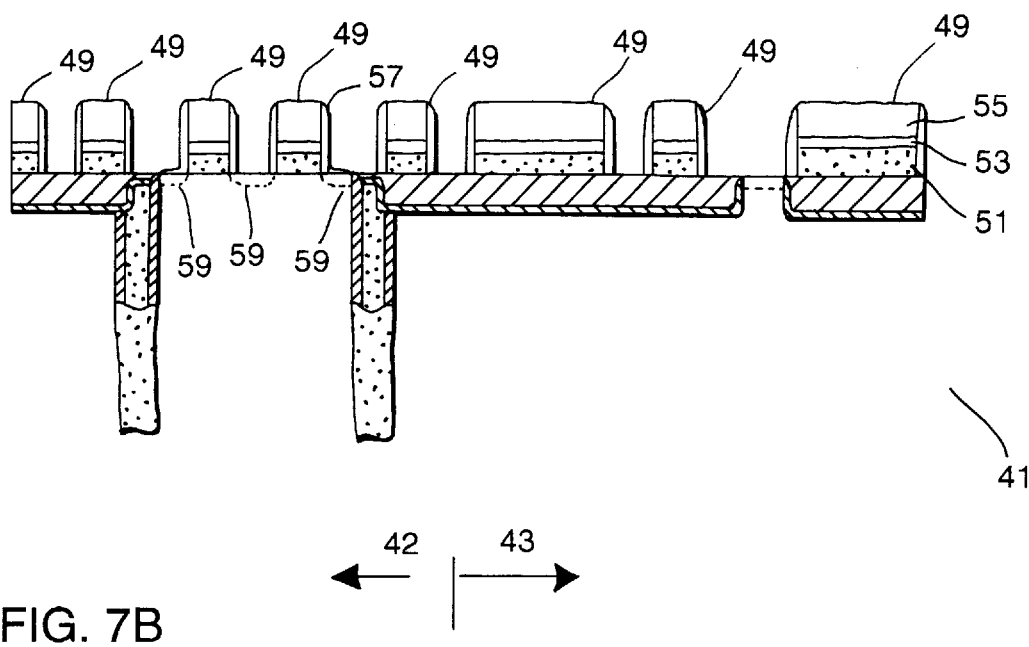

A method for manufacturing a dynamic random access memory (DRAM) device in accordance with the present invention will be described with reference to FIGS. 7A–7E. As shown in FIG. 7A, a semiconductor substrate 41 includes a memory cell region 42 and a peripheral circuit region 43. Trench capacitors having polycrystalline silicon 45 are formed in memory cell region 42 and a shallow trench isolation region 47 of, for example, silicon dioxide is formed in peripheral circuit region 43. These trench capacitors may be formed in any manner known in the art and the invention is not limited in this respect. One manner of forming the trench capacitor is described in U.S. patent application Ser. No. 08/412,442, which is incorporated herein by reference. With reference to FIG. 7B, a plurality of gate electrode structures 49 are formed on semiconductor substrate 41. Gate electrode structures 49 are multi-layer structures including a polycrystalline silicon layer 51, a tungsten silicon layer 53, and a silicon nitride layer 55. The side walls of these gate electrode structures are covered by a first silicon nitride layer 57. After formation of the gate electrode structures 49, source and drain regions 59 are formed by ion-implantation using gate electrode structures 49 as a mask.

Figure 7C:
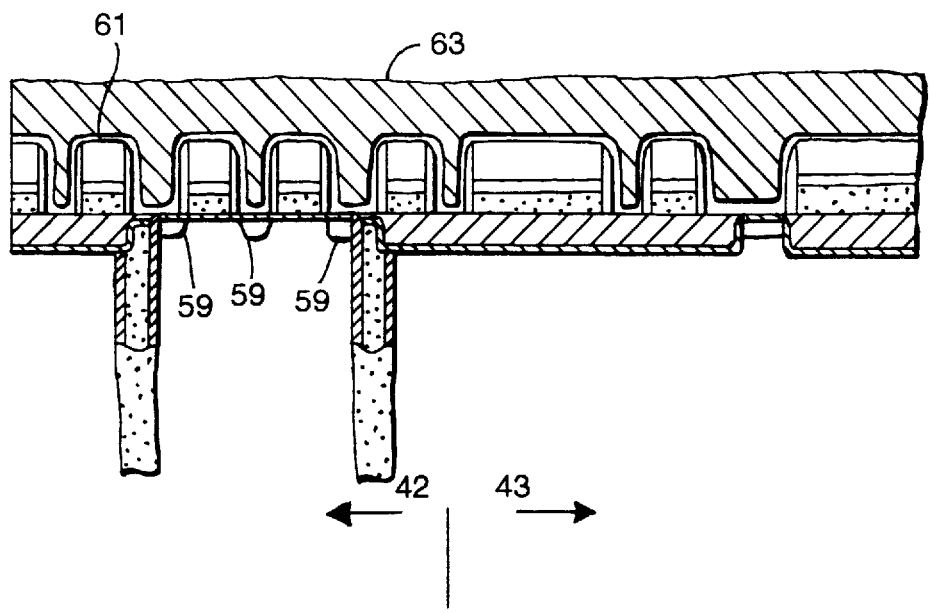
Figure 7D:
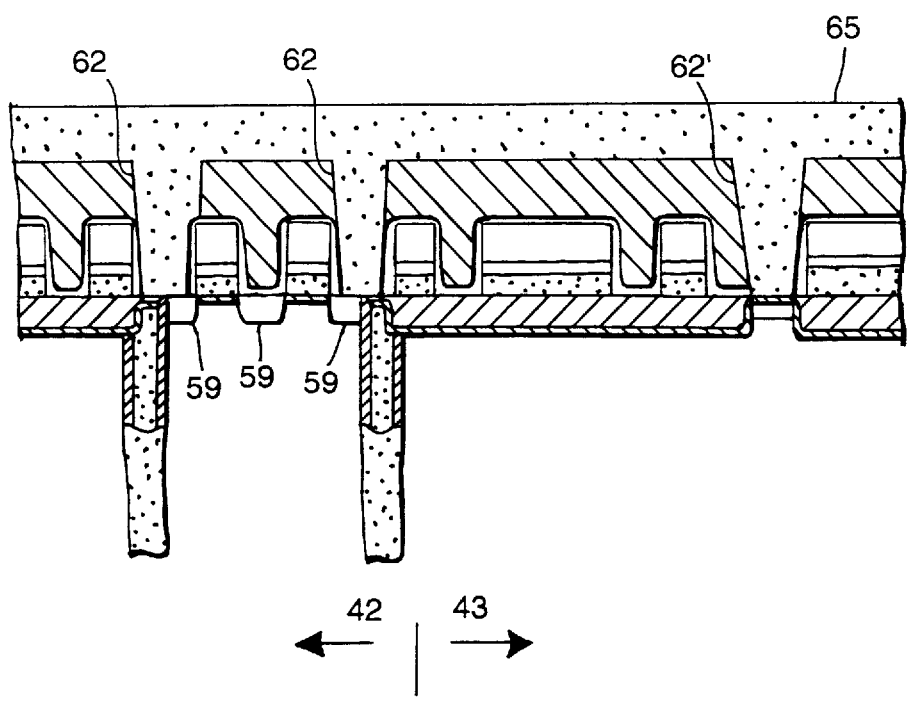
Figure 7E:
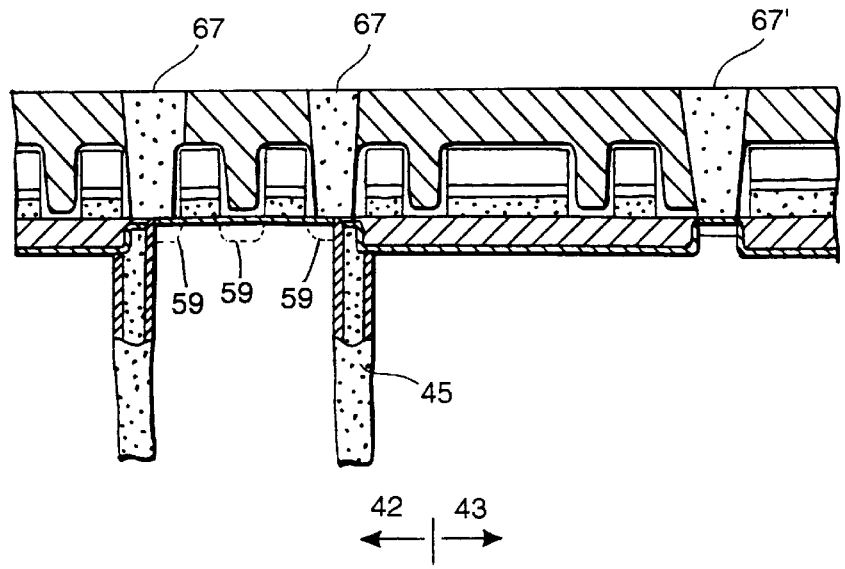

With reference to FIG. 7C, a second silicon nitride layer 61 is formed to cover the upper surface of the semiconductor substrate and the gate electrode structures 49. Subsequently, a BPSG (boron-phosphorous-silicate-glass) layer 63 is formed to cover second silicon nitride layer 61. With reference to FIG. 7D, surface strap holes 62 for self-aligned strap plugs for connecting the trench capacitors to the switching transistors and for other wirings are formed in BPSG layer 63 and second silicon nitride layer 61 using a photolithography process and a reactive ion etching process. A polycrystalline silicon layer 65 is then deposited to fill the surface strap holes and cover BPSG layer 63. In this embodiment, an additional surface strap hole 62' is formed in the BPSG layer 63 and second silicon nitride layer 61 to provide for a polycrystalline silicon plug in peripheral circuit region 43. With reference to FIG. 7E, polycrystalline silicon layer 65 is etched by reactive ion etching or chemical mechanical etching to be level with BPSG layer 63. Polycrystalline silicon plugs 67 for connecting the trench capacitors to the switching transistors and for other wirings and a polycrystalline silicon plug 67' for diffusion of hydrogen are formed by this etching process. A hydrogen anneal is carried out at the end of the LSI processing. Hydrogen can diffuse into the memory cell area through the plugs 67. In addition, hydrogen can diffuse into the peripheral circuit region through the plug 67'. In accordance with the embodiment of the present invention described above, plug 67' is formed in the same process step as the strap plugs 67 for the memory cells and thus no extra processing steps are required. As noted above, it is not necessary to electrically connect plug 67' to the semiconductor device.

In order to provide polycrystalline silicon plug 67' for the diffusion of hydrogen, it is only necessary to make an additional surface strap hole 62' in addition to the conventional surface strap holes 62. Thus, the teachings of the present invention may be easily integrated into conventional DRAM manufacturing processes for a 64 Mbit DRAM, for example, since it is only necessary to change the mask for etching BPSG layer 63. No additional manufacturing steps are required to fabricate the DRAM of FIG. 7 as compared with the fabrication of conventional DRAM devices. In addition, the additional surface strap hole 62' may be located anywhere (e.g, on a diffusion area or an isolation area) in the peripheral circuit region 43. Although strap plugs are formed in the memory cell area, additional plugs for diffusing hydrogen into the memory cell area may be provided, if desired. Further, the formation of a polycrystalline silicon plug for diffusion of hydrogen may be achieved without increasing the chip area.

Figure 8:
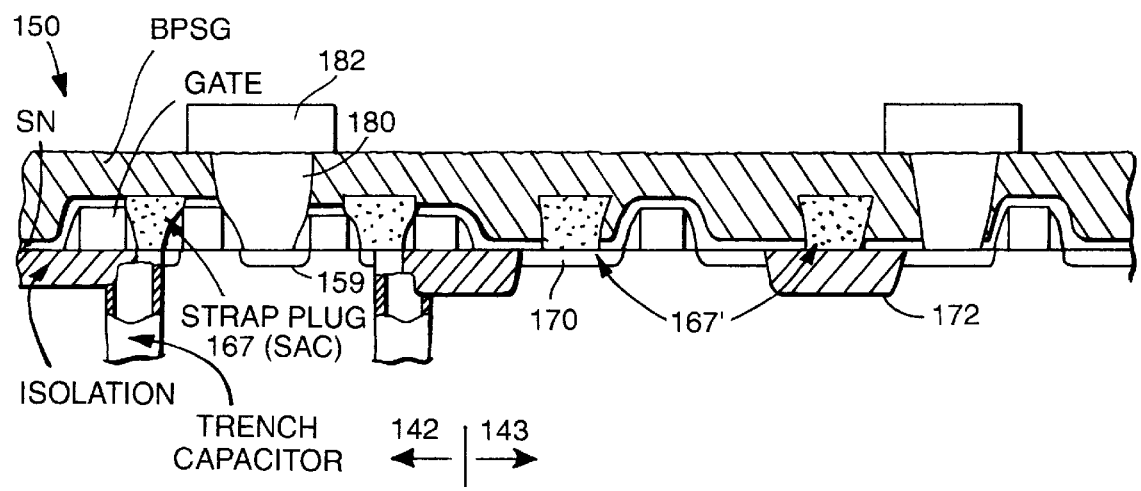
FIG. 8 illustrates a completed semiconductor memory device in accordance with the present invention.

FIG. 8 shows one example of the relevant portions of a completed device in accordance with an embodiment of the present invention. FIG. 8 shows a memory cell region 142 and a peripheral circuit region 143. Memory cell region 142 includes strap plugs 167 for connecting the trench capacitors to the switching transistors. Peripheral circuit region 143 includes strap plugs 167' for permitting the diffusion of hydrogen. As shown, strap plugs 167' may be formed on a diffusion region e.g., diffusion 170, or on an isolation region, e.g., isolation region 172. In this illustrative, but non-limiting, figure, plugs 167' are not electrically connected to the memory device. Memory device 150 further includes a self-aligned contact 180 for contacting the source/drain region 159 of the illustrated memory cells. A bit line 182 is formed on contact 180.

The teachings of the present application may be applied to semiconductor devices other than DRAMs, e.g., logic circuit devices. However, additional manufacturing steps may be needed for these devices as compared with the manufacturing of conventional devices since surface strap holes are generally not needed for semiconductor devices other than DRAM devices. In addition, additional manufacturing steps may be required for DRAM devices which do not utilize the strap plugs shown in the manufacturing process of FIG. 7. Therefore, additional steps of etching a contact hole, depositing a polycrystalline silicon layer into the contact hole, and etching the polycrystalline silicon may be needed to incorporate the teachings of the present invention in semiconductor devices. Nonetheless, despite an increase in the number of manufacturing steps, hydrogen may be introduced in the semiconductor substrates on which these devices are formed and thus junction leakage may be reduced. In short, the utilization of the present invention in semiconductor devices is beneficial and useful even though an increase in the number of manufacturing steps may be required. It is again noted that no additional process steps are needed to fabricate the DRAM device of FIG. 7 in accordance with the present invention as compared to manufacturing a conventional DRAM device. It is only necessary to modify a mask to fabricate the plug for hydrogen diffusion in a DRAM.

As discussed above, a polycrystalline silicon plug may be used to permit the diffusion of hydrogen into a semiconductor substrate. In this way junction leakage can be prevented in devices in which a layer which is a barrier to hydrogen diffusion is formed over a semiconductor substrate.

While the invention has been described in detail with reference to the appended drawings, the invention is limited in scope only by the claims. Moreover, any publication cited herein should be construed to be incorporated by reference as to any subject matter deemed essential to the present disclosure.

We claim:

1. In a semiconductor device formed on a semiconductor substrate and including a layer formed on said semiconductor substrate which is substantially a barrier to hydrogen, a plug, formed of a material through which hydrogen can diffuse, disposed in an opening through said layer and contacting a surface of said semiconductor substrate, said plug not being electrically connected to said semiconductor device.

2. The plug according to claim 1, wherein said plug is a polycrystalline silicon plug.

3. The plug according to claim 1, wherein said plug is an amorphous silicon plug.

4. A semiconductor device, comprising:

a semiconductor substrate of a first conductivity type;

an isolation region formed on said semiconductor substrate to define an isolated element region;

a transistor formed in said isolated element region, said transistor comprising source and drain regions of a second conductivity type formed in said semiconductor substrate and spaced apart by a channel region, and a gate electrode insulatively spaced from said channel region;

a layer formed on said source and drain regions, said gate electrode, and said isolation region, said layer being substantially a barrier to hydrogen diffusion;

an opening formed in said layer to expose one of said source region, said drain region, and said isolation region; and a plug formed in said opening, said plug being formed of a material through which hydrogen can diffuse and said plug not electrically connected to said semiconductor device.

5. The semiconductor device according to claim 4, wherein said plug is a polycrystalline silicon plug.

6. The semiconductor device according to claim 4, wherein said layer is a silicon nitride layer.

7. The semiconductor device according to claim 4, wherein said opening exposes said isolation region.

8. The semiconductor device according to claim 4, wherein said isolation region is a silicon dioxide isolation region.

9. The semiconductor device according to claim 4, wherein said plug is an amorphous silicon plug.

10. A semiconductor memory device, comprising:

a semiconductor substrate of a first conductivity type including a memory cell region and a peripheral circuit region;

a memory cell formed in said memory cell region, said memory cell comprising a data storage capacitor and a switching transistor having source and drain regions spaced apart by a channel region and a gate electrode insulatively spaced from said channel region;

a first plug contacting one of said source and drain regions and electrically connecting said one of said source and drain regions to said switching transistor; and a second plug contacting said semiconductor substrate in said peripheral circuit region, said second plug not being electrically connected to said semiconductor memory device.

11. The semiconductor memory device according to claim 10, wherein said first and second plugs are polycrystalline silicon plugs.

12. The semiconductor memory device according to claim 10, wherein said data storage capacitor is disposed in a trench formed in said semiconductor substrate.

* * * * *